United States Patent
Zhu et al.

(10) Patent No.: US 10,965,086 B2
(45) Date of Patent: Mar. 30, 2021

(54) OPTICAL RESONANT CAVITY AND DISPLAY PANEL

(71) Applicant: BOE TECHNOLOGY GROUP CO., LTD., Beijing (CN)

(72) Inventors: Ming Zhu, Beijing (CN); Xue Dong, Beijing (CN); Xiaochuan Chen, Beijing (CN); Shiyu Zhang, Beijing (CN); Meili Wang, Beijing (CN); Xuan Liang, Beijing (CN); Yingtao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/630,270

(22) PCT Filed: Feb. 22, 2019

(86) PCT No.: PCT/CN2019/075922
§ 371 (c)(1),
(2) Date: Jan. 10, 2020

(87) PCT Pub. No.: WO2019/196563
PCT Pub. Date: Oct. 17, 2019

(65) Prior Publication Data
US 2020/0235543 A1    Jul. 23, 2020

(30) Foreign Application Priority Data
Apr. 8, 2018    (CN) .......................... 201810306414.5

(51) Int. Cl.
*H01S 3/08*    (2006.01)
*G02F 1/1335*    (2006.01)
(Continued)

(52) U.S. Cl.
CPC .............. *H01S 3/08* (2013.01); *G02F 1/1343* (2013.01); *G02F 1/133528* (2013.01); *G02F 1/155* (2013.01); *G02F 1/157* (2013.01)

(58) Field of Classification Search
CPC .... H01S 3/08; G02F 1/133528; G02F 1/1343; G02F 1/155; G02F 1/157
See application file for complete search history.

(56) References Cited

U.S. PATENT DOCUMENTS 6,678,297 B2 * 1/2004 Kopp ........................ H01S 3/20
                                                          257/40
7,804,873 B2 * 9/2010 Liu ...................... H01S 5/04253
                                                         372/50.11
(Continued)

FOREIGN PATENT DOCUMENTS

CN           1731635 A    2/2006
CN         101447644 A    6/2009
(Continued)

OTHER PUBLICATIONS

International Search Report of PCT/CN2019/075922 in Chinese, dated May 9, 2019, with English translation.

*Primary Examiner* — Nathanael R Briggs
(74) *Attorney, Agent, or Firm* — Collard & Roe, P.C.

(57) ABSTRACT

Embodiments of the present disclosure provide an optical resonant cavity and a display panel. The optical resonant cavity includes a light conversion layer, the optical resonant cavity is configured to emit light with a specific wavelength range, and the light conversion layer is arranged at at least one wave node of a center wavelength of the light with the specific wavelength range in the optical resonant cavity.

19 Claims, 5 Drawing Sheets

(51) Int. Cl.
  *G02F 1/1343* (2006.01)
  *G02F 1/155* (2006.01)
  *G02F 1/157* (2006.01)

(56) References Cited

U.S. PATENT DOCUMENTS

| | | | |
|---|---|---|---|
| 2014/0023380 A1* | 1/2014 | Takeda | H04B 10/503 398/200 |
| 2015/0362728 A1* | 12/2015 | Tei | G02B 5/3033 353/20 |
| 2019/0217782 A1* | 7/2019 | Weller | B60R 1/10 |
| 2020/0174324 A1* | 6/2020 | Yoshitomi | G02F 1/134309 |
| 2020/0185283 A1* | 6/2020 | Henley | H01L 33/0095 |

FOREIGN PATENT DOCUMENTS

| | | |
|---|---|---|
| CN | 102751312 A | 10/2012 |
| CN | 107221548 A | 9/2017 |
| CN | 206757181 U | 12/2017 |

* cited by examiner

OPTICAL RESONANT CAVITY AND DISPLAY PANEL

CROSS REFERENCE TO RELATED APPLICATIONS

This application is the National Stage of PCT/CN2019/075922 filed on Feb. 22, 2019, which claims priority under 35 U.S.C. § 119 of Chinese Application No. 201810306414.5 filed on Apr. 8, 2018, the disclosure of which is incorporated by reference.

TECHNICAL FIELD

Embodiments of the present disclosure relate to an optical resonant cavity and a display panel.

BACKGROUND

An optical resonant cavity selects the light incident into therein, so that light with a specific wavelength is emitted from the optical resonant cavity by adjusting an light path in the optical resonant cavity. Constructive interference occurs to the light with the specific wavelength in the optical resonant cavity, so that the light with the specific wavelength is emitted with greater brightness. Light with other wavelengths incident into the optical resonant cavity repeatedly oscillates in the optical resonant cavity to undergo destructive interference or be absorbed by other structures. Therefore, existing optical resonant cavities have small light utilization and low light output.

SUMMARY

At least one embodiment of the present disclosure provides an optical resonant cavity, and the optical resonant cavity comprises: an light conversion layer, the optical resonant cavity is configured to emit light with a specific wavelength range, and the light conversion layer is arranged at at least one wave node of a center wavelength of the light with the specific wavelength range in the optical resonant cavity.

For example, the optical resonant cavity provided by at least one embodiment of the present disclosure, further comprises: a first functional layer; a second functional layer, arranged opposite to the first functional layer; an optical medium layer, arranged between the first functional layer and the second functional layer; and the light conversion layer is located in the optical medium layer, and the light with the specific wavelength range is emitted from the first functional layer.

For example, in the optical resonant cavity provided by at least one embodiment of the present disclosure, the optical resonant cavity is a transmissive optical resonant cavity, and each of the first functional layer and the second functional layer is a transflective film; or the optical resonant cavity is a reflective optical resonant cavity, the first functional layer is a transflective film, and the second functional layer is a total reflection film.

For example, in the optical resonant cavity provided by at least one embodiment of the present disclosure, a sum of an optical thickness of the optical medium layer and an optical thickness of the light conversion layer is a positive integer multiple of a half of the central wavelength of the light with the specific wavelength range.

For example, in the optical resonant cavity provided by at least one embodiment of the present disclosure, a refractive index of the light conversion layer is greater than a refractive index of the optical medium layer.

For example, in the optical resonant cavity provided by at least one embodiment of the present disclosure, a distance between a thickness center plane of the light conversion layer and the wave node of the center wavelength of the light with the specific wavelength range is not greater than $\frac{1}{30}$ of the center wavelength.

For example, in the optical resonant cavity provided by at least one embodiment of the present disclosure, a thickness of the light conversion layer is not more than $\frac{1}{30}$ of the central wavelength of the light with the specific wavelength range.

For example, in the optical resonant cavity provided by at least one embodiment of the present disclosure, the light with the specific wavelength range is a monochromatic light.

For example, in the optical resonant cavity provided by at least one embodiment of the present disclosure, the monochromatic light is one of red light, green light and blue light.

For example, in the optical resonant cavity provided by at least one embodiment of the present disclosure, a material of the light conversion layer comprises an up-conversion luminescent material and/or a down-conversion luminescent material for obtaining the monochromatic light.

For example, in the optical resonant cavity provided by at least one embodiment of the present disclosure, the up-conversion luminescent material comprises an inorganic compound doped with rare earth ions, and the down-conversion luminescent material comprises a fluorescent material or a quantum dot material.

For example, in the optical resonant cavity provided by at least one embodiment of the present disclosure, the optical resonant cavity comprises a silver film, a first silicon dioxide film, a light conversion material film, a second silicon dioxide film and a titanium dioxide film which are stacked in sequence; and the titanium dioxide film is used as the first functional layer, the silver film is used as the second functional layer, the first silicon dioxide film and the second silicon dioxide film are together used as the optical medium layer, and the light conversion material film is used as the light conversion layer.

For example, in the optical resonant cavity provided by at least one embodiment of the present disclosure, the optical resonant cavity comprises a plurality of the light conversion layers, the plurality of the light conversion layers are spaced apart from each other, and the plurality of the light conversion layers are arranged at different wave nodes of the central wavelength of the light with the specific wavelength range.

For example, the optical resonant cavity provided by at least one embodiment of the present disclosure, further comprises: an antireflection film; if the optical resonant cavity is the transmissive optical resonant cavity, the antireflection film is arranged on a side of the second functional layer away from the first functional layer, and if the optical resonant cavity is the reflective optical resonant cavity, the antireflection film is arranged on a side of the first functional layer away from the second functional layer.

For example, the optical resonant cavity provided by at least one embodiment of the present disclosure, further comprises: a metal absorption layer; and the metal absorption layer is arranged on a side of the first functional layer, or is arranged in the first functional layer.

At least one embodiment of the present disclosure further provides a display panel, and the display panel comprises: any one of the optical resonant cavities in the embodiments mentioned above.

For example, the display panel provided by at least one embodiment of the present disclosure, further comprises: a light intensity control structure, the light intensity control structure and the optical resonant cavity are stacked, and the light intensity control structure is configured to control an intensity of light passing through the light intensity control structure.

For example, in the display panel provided by at least one embodiment of the present disclosure, the display panel is a reflective display panel, the light intensity control structure and the optical resonant cavity are arranged in sequence from a display side of the display panel to a non-display side of the display panel, and the optical resonant cavity is the reflective optical resonant cavity to realize light reflection; or the display panel is a transmissive display panel, and the optical resonant cavity is a transmissive optical resonant cavity.

For example, in the display panel provided by at least one embodiment of the present disclosure, the light intensity control structure is an electrochromic light intensity control structure or a liquid crystal light intensity control structure, the electrochromic light intensity control structure comprises a first electrode, a second electrode and an electrochromic layer, and the first electrode and the second electrode are configured to control the electrochromic layer if an electric signal is applied to the first electrode and the second electrode; and the liquid crystal light intensity control structure comprises a third electrode, a fourth electrode, a first polarization layer, a second polarization layer and a liquid crystal layer, a first polarization direction of the first polarization layer is perpendicular to a second polarization direction of the second polarization layer, the liquid crystal layer is sandwiched between the first polarization layer and the second polarization layer, and the third electrode and the fourth electrode are configured to control the liquid crystal layer if an electrical signal is applied to the third electrode and the fourth electrode.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

Figure 1A:
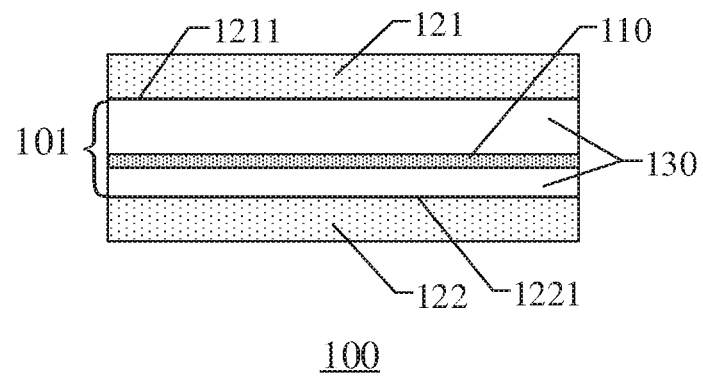
FIG. 1A is a structural schematic diagram of an optical resonant cavity provided by at least one embodiment of the present disclosure.

In order to make objects, technical details and advantages of embodiments of the present disclosure clear, the technical solutions of the embodiments will be described in a clearly and fully understandable way in connection with the related drawings. It is apparent that the described embodiments are just a part but not all of the embodiments of the present disclosure. Based on the described embodiments herein, those skilled in the art can obtain, without any inventive work, other embodiment(s) which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and claims of the present disclosure, are not intended to indicate any sequence, amount or importance, but distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or a mechanical connection, but may comprise an electrical connection which is direct or indirect. The terms "on," "under," "right," "left" and the like are only used to indicate relative position relationship, and in a case that the position of an object is described as being changed, the relative position relationship may be changed accordingly.

At least one embodiment of the present disclosure provides an optical resonant cavity, the optical resonant cavity comprises a light conversion layer, the optical resonant cavity is configured to emit light with a specific wavelength range, and the light conversion layer is arranged at at least one wave node of a center wavelength of the light with the specific wavelength range in the optical resonant cavity. The optical resonant cavity is configured to emit light with the specific wavelength range, thus a wave of the light with the specific wavelength range resides in the optical resonant cavity, so that a position of the light conversion layer in the optical resonant cavity is determined according to the wave, which resides in the optical resonant cavity, of the light with the specific wavelength range. The light conversion layer converts light with other wavelengths than the specific wavelength range into the light with the specific wavelength range, so that light output of the optical resonant cavity is increased. In addition, the light conversion layer is arranged at the wave node of the central wavelength of the light with the specific wavelength range in the optical resonant cavity, so that the absorption of the light with the specific wavelength range is reduced. In addition, in this case, the light conversion layer is located at a non-wave node (that is, a position that is not provided with the wave node) of the light with other wavelengths, so that the absorption of the light with other wavelengths is increased, and the light output of the optical resonant cavity is further increased. The optical resonant cavity comprises a resonant cavity (in other words, a resonant space), the resonant cavity comprises two opposite and parallel side surfaces with light reflectivity (for example, total reflection or transflective reflection occurs at the side surfaces), the light travels back and forth (reflects back and forth) between the two side surfaces of the resonant cavity to achieve resonance, and the resonance causes the light with the specific wavelength range to emit out from one of the two side surfaces. The two side surfaces are called as resonance surfaces, and a vertical distance between the resonance surfaces defines a length of the resonant cavity. Correspondingly, wave nodes of the central wavelength of the light with the specific wavelength range in the optical resonant cavity respectively coincide with the resonance surfaces. The embodiments of the present disclosure do not limit the side surfaces of the resonant cavity that are not used to achieve the resonance.

It should be noted that, in at least one embodiment of the present disclosure, "the light conversion layer being arranged at the wave node of the center wavelength of the light with the specific wavelength range in the optical resonant cavity" means that: the light conversion layer coincides with the wave node in the optical resonant cavity or is located close to the wave node in the optical resonant cavity. For example, a distance between the light conversion layer and the wave node of the central wavelength is smaller than a distance between the light conversion layer and an antinode of the central wavelength.

In at least one embodiment of the present disclosure, the above center wavelength of the light with the specific wavelength range is called as a design wavelength of the optical resonant cavity. In the following, in the technical solutions of at least one of the following embodiments in the present disclosure, the design wavelength of the optical resonant cavity represents the above central wavelength of the light with the specific wavelength range, and the design wavelength range represents the above specific wavelength range. For example, the design wavelength of the optical resonant cavity is 630 nm, that is, the optical resonant cavity is configured to emit red light with the central wavelength of 630 nm; at least one wave node of the light with the wavelength of 630 nm is at a same position as the antinode of blue light with the wavelength of 420 nm, in a case that the light conversion layer is located at such same position, the light conversion layer does not absorb the red light with the wavelength of 630 nm, but the light conversion layer has the highest absorption of the blue light with the wavelength of 420 nm. In this way, not only the absorption of the light with the design wavelength range (i.e. the light with the above specific wavelength range) in the incident light is minimized, but also a conversion amount of light with a non-design wavelength range into the light with the design wavelength range is maximized, and the amount of the light emitted from the optical resonant cavity is further increased.

In the following, the optical resonant cavity according to at least one embodiment of the present disclosure and the display panel according to at least one embodiment of the present disclosure are described with reference to the drawings.

Figure 1B:
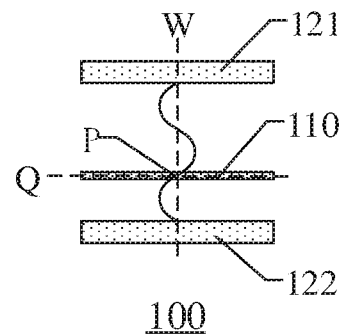
FIG. 1B is a light path of the optical resonant cavity illustrated in FIG. 1A.

FIG. 1A is a structural schematic diagram of the optical resonant cavity provided by at least one embodiment of the present disclosure, and FIG. 1B is a light path of the optical resonant cavity illustrated in FIG. 1A.

For example, in at least one embodiment of the present disclosure, as illustrated in FIG. 1A and FIG. 1B, the optical resonant cavity 100 comprises the light conversion layer 110, the optical resonant cavity 100 is configured to emit the light with the specific wavelength range, the wave node of the center wavelength of the light with the specific wavelength range in the optical resonant cavity 100 is P, and the light conversion layer 110 is arranged at the wave node P. The light conversion layer 110 does not absorb the light with the design wavelength range, and the light conversion layer 110 absorbs the light with the non-design wavelength range (i.e. a range outside the design wavelength range) to convert the light with the non-design wavelength range into the light with the design wavelength range, which increases the light output of the light with the design wavelength range.

For example, in at least one embodiment of the present disclosure, the optical resonant cavity further comprises: a first functional layer, a second functional layer and an optical medium layer; the second functional layer is arranged opposite to the first functional layer; the optical medium layer is arranged between the first functional layer and the second functional layer, the light conversion layer is located in the optical medium layer; and the light with the specific wavelength range is emitted from the first functional layer. For example, as illustrated in FIG. 1A and FIG. 1B, the optical resonant cavity 100 comprises the first functional layer 121, the optical medium layer 130, and the second functional layer 122 which are stacked in sequence. The light conversion layer 110 is located in the optical medium layer 130. Both the first functional layer 121 and the second functional layer 122 are highly reflective layers relative to the optical medium layer 130, so that the light entering the optical resonant cavity 100 is reflected back and forth between the first functional layer 121 and the second functional layer 122. The light meets the design wavelength requirement of the optical resonant cavity 100 undergoes the constructive interference during the reflection process, so that the light is emitted out from the optical resonant cavity 100 with greater brightness. The design wavelength depends on a length L of the resonant cavity 101 of the optical resonant cavity 100 and the optical properties (such as refractive index) of the resonant cavity 101. For example, in a case that the resonant cavity 101 comprises the optical medium layer 130 and the light conversion layer 110, a sum of an optical thickness (product of an actual thickness and the refractive index) of the optical medium layer 130 and an optical thickness (product of an actual thickness and the refractive index) of the light conversion layer 110 is a positive integer multiple of a half of the design wavelength. At this time, the length L of the resonant cavity 101 is a sum of the actual thickness of the optical medium layer 130 and the actual thickness of the light conversion layer 110. Therefore, in the above mentioned embodiments, the first functional layer and the second functional layer which are opposite to each other have light reflectivity, and a surface 1211 of the first functional layer 121 facing the second functional layer 122 and a surface 1221 of the second functional layer 122 facing the first functional layer 121 serve as the resonance surfaces of the resonant cavity 101, that is, the two surfaces (1211 and 1221) define the resonant cavity 101 of the optical resonant cavity 100.

In at least one embodiment of the present disclosure, there is no limitation to the type of the optical resonant cavity, and accordingly, the first functional layer and the second functional layer are arranged according to the type of the optical resonant cavity.

For example, in the optical resonant cavity provided by at least one embodiment of the present disclosure, the optical resonant cavity is a transmissive optical resonant cavity, and each of the first functional layer and the second functional layer is a transflective film. For example, the reflectivity of the second functional layer to the light with the design wavelength is greater than the reflectivity of the first functional layer to the light with the design wavelength, so that the light with the design wavelength is emitted from the first functional layer. For example, the light incident into the transmissive optical resonant cavity comprises the light incident into the optical resonant cavity through the second functional layer, or the light incident into the optical resonant cavity through the first functional layer.

For example, in the optical resonant cavity provided by at least one embodiment of the present disclosure, the optical resonant cavity is a reflective optical resonant cavity, the first functional layer is the transflective film, and the second functional layer is a total reflection film.

In at least one embodiment of the present disclosure, there is no limitation to the reflectivity of the first functional layer, which is selected according to requirements. The greater the reflectivity of the first functional layer is, the smaller a full width at half maximum of a transmission band of the first functional layer, accordingly, the narrower the design wavelength range of the emitted light, that is, the better the monochromaticity of the emitted light.

Figure 1C:
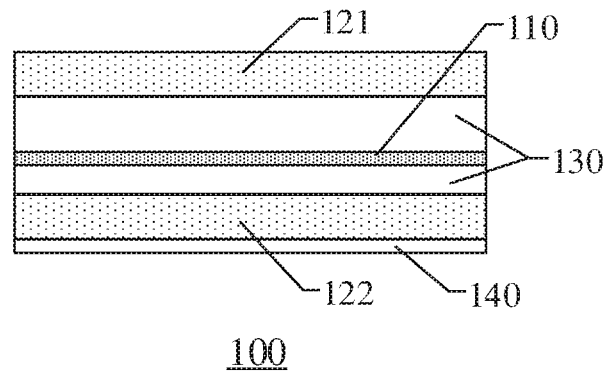
FIG. 1C is a structural schematic diagram of the optical resonant cavity provided by another embodiment of the present disclosure.
Figure 1D:
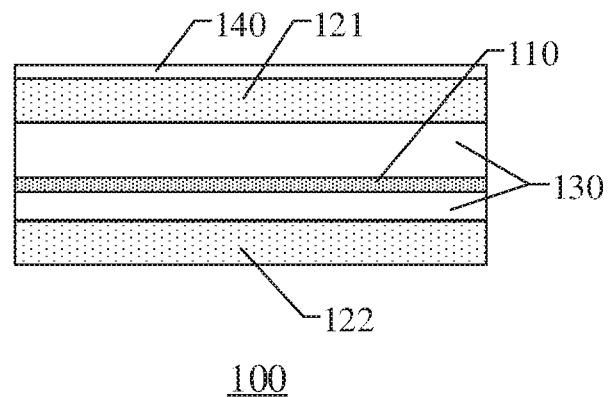
FIG. 1D is a structural schematic diagram of the optical resonant cavity provided by still another embodiment of the present disclosure.

For example, in the optical resonant cavity provided by at least one embodiment of the present disclosure, the optical resonant cavity further comprises an antireflection film. The antireflection film is located on a light incident side of the optical cavity, which increases an amount of light entering the optical resonant cavity, and further the light output of the light with the design wavelength range is increased. For example, as illustrated in FIG. 1C, in a case that the optical resonant cavity is the transmissive optical resonant cavity, a side of the second functional layer 122 away from the first functional layer 121 is provided with the antireflection film 140. For example, as illustrated in FIG. 1D, in a case that the optical resonant cavity is the reflective optical resonant cavity, a side of the first functional layer 121 away from the second functional layer 122 is provided with the antireflection film 140.

For example, in the optical resonant cavity provided by at least one embodiment of the present disclosure, the sum of the optical thickness of the optical medium layer and the optical thickness of the light conversion layer is the positive integer multiple of the half of the central wavelength of the light with the specific wavelength range. In this way, the above mentioned light with the central wavelength undergoes constructive interference between the first functional layer 121 and the second functional layer 122. The optical thickness is the product of the actual thickness of a structural layer and a refractive index of the structural layer. For example, as illustrated in FIG. 1A and FIG. 1B, a plane where the first functional layer 121 is located is parallel to a plane where the second functional layer 122 is located. In a direction perpendicular to the plane where the first functional layer 121 is located, a sum of the product of the thickness of the optical medium layer 130 and the refractive index of the optical medium layer 130 and the product of the thickness of the light conversion layer 110 and the refractive index of the light conversion layer 110 is a positive integer multiple of the half of the design wavelength.

In at least one embodiment of the present disclosure, a material of the optical medium layer is not limited. For example, the material of the optical medium layer includes air, an inorganic material, or an organic material. For example, the inorganic material is a low refractive index material such as silicon dioxide, magnesium fluoride and so on.

For example, in at least one embodiment of the present disclosure, only one light conversion layer is disposed in the optical resonant cavity; or a plurality of light conversion layers spaced apart from each other are disposed in the optical resonant cavity. For example, the plurality of the light conversion layers are respectively disposed at wave nodes of the design wavelength of the optical resonant cavity, which further increases the absorption of the light with the non-design wavelength, and accordingly, the output of the light with the design wavelength is further increased. The total number of the light conversion layers is designed according to the optical thickness between the first functional layer 121 and the second functional layer 122.

For example, in the optical resonant cavity provided by at least one embodiment of the present disclosure, the refractive index of the light conversion layer is greater than the refractive index of the optical medium layer. In this way, due to the principle of total reflection, the light conversion layer is also used as a reflection layer, so that light is reflected between adjacent light conversion layers or between the light conversion layer and the functional layer (the first functional layer or the second functional layer). For example, in a case that the light conversion layer is used as the reflective layer, a plurality of resonant cavities are formed between the first functional layer and the second functional layer, which further increases the degree of elimination of the light with the non-design wavelength, and the output of the light with the design wavelength and the brightness of the light with the design wavelength are further increased. For example, the light conversion layer is arranged to have a large extinction coefficient to increase the absorption of the light with the non-design wavelength.

In at least one embodiment of the present disclosure, there is no limitation to the specific position of the light conversion layer in the optical resonant cavity, as long as the light conversion layer is located at the wave node of the design wavelength; for example, the light conversion layer coincides with the wave node, or a distance between the light conversion layer and the wave node is within an acceptable range. For example, in the optical resonant cavity provided by at least one embodiment of the present disclosure, a distance between a thickness center plane (i.e. a plane in which a thickness center of the light conversion layer is provided) within the light conversion layer and the wave node of the center wavelength of the light with the specific wavelength range is not greater than $1/30$ of the center wavelength. Within the above range, the light conversion layer absorbs very little light with the design wavelength range, which increases the output of the light with the design wavelength range. For example, as illustrated in FIG. 1B, the plane where the first functional layer 121 is located, the plane where the second functional layer 122 is located, and the thickness center plane Q of the light conversion layer are parallel to each other; in the direction perpendicular to the plane where the first function layer 121 is located (such as the dotted line W shown in FIG. 1B), the distance between the thickness center plane Q and the wave node P is not more than $1/30$ of the design wavelength.

In at least one embodiment of the present disclosure, there is no limitation to the specific position of the light conversion layer in the optical resonant cavity, as long as the light conversion layer absorbs the light with the design wavelength range within an acceptable range. For example, in the optical resonant cavity provided by at least one embodiment of the present disclosure, a thickness of the light conversion layer is not more than 1/30 of the central wavelength of the light with the specific wavelength range. Within the above range, a main surface of the light conversion layer is far from the antinode of the light with the design wavelength, and thus the light conversion layer absorbs very little light with the design wavelength range, which increases the output of the light with the design wavelength range.

Figure 1E:
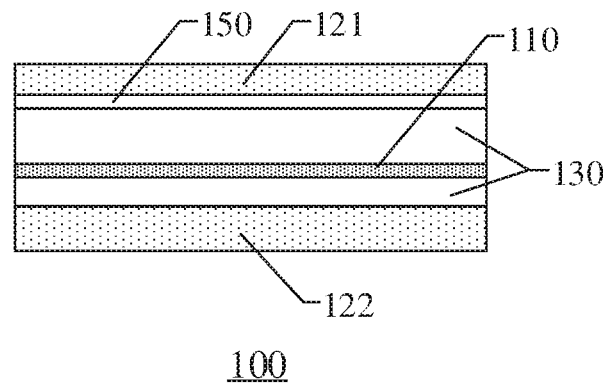
FIG. 1E is a structural schematic diagram of the optical resonant cavity provided by still another embodiment of the present disclosure.

For example, in at least one embodiment of the present disclosure, the optical resonant cavity further comprises a metal absorption layer. For example, as illustrated in FIG. 1E, the metal absorption layer 150 is arranged on a side of the first functional layer 121, or the metal absorption layer 150 is arranged in the first functional layer. The metal absorption layer absorbs the light with the non-design wavelength range and the monochromaticity of the light emitted from the optical resonant cavity is improved.

For example, in at least one embodiment of the present disclosure, a film system of the optical resonant cavity is provided as follows. As shown in the First Table below, the optical resonant cavity emits red light with the center wavelength of 620 nm.

First Table

| layers | material | thickness (nm) |
| --- | --- | --- |
| eighth | titanium dioxide | 47.4 |
| seventh | chromium | 6.56 |
| sixth | titanium dioxide | 105.38 |
| fifth | silicon dioxide | 473.1 |
| fourth | optical conversion material | 9.98 |
| third | silicon dioxide | 187.22 |
| second | silver | 150 |
| first | chromium | 19.94 |
| base substrate | glass | |

In the optical resonant cavity shown in the First Table, the first layer of chromium and the second layer of silver are combined to be used as a high reflective layer (the second functional layer), in this case, the second functional layer is a total reflection layer. An adhesion between the chromium layer and the base glass is stronger than an adhesion between the silver layer and the base glass. At this time, the first layer of chromium is mainly used to fix the optical resonant cavity on the base substrate. In at least one embodiment of the present disclosure, it is not necessary to provide the first layer of chromium. For example, in some examples, the second layer of silver is replaced with a high reflective index layer such as an aluminum layer, a gold layer, or a copper layer, which are not limited in the embodiments of the present disclosure. For example, the sixth layer of titanium dioxide, the seventh layer of chromium, and the eighth layer of titanium dioxide are combined to be used as a high reflective layer (the first functional layer), and the seventh layer of chromium is used as the metal absorption layer. The third layer of silicon dioxide and the fifth layer of silicon dioxide are combined to be used as the optical medium layer, the fourth layer of optical conversion material is the light conversion layer, and the light conversion layer is located in the optical medium layer. Under the film system shown in the First Table, the light conversion layer is located at the light wave node of the light with the wavelength of 620 nm.

Figure 5:
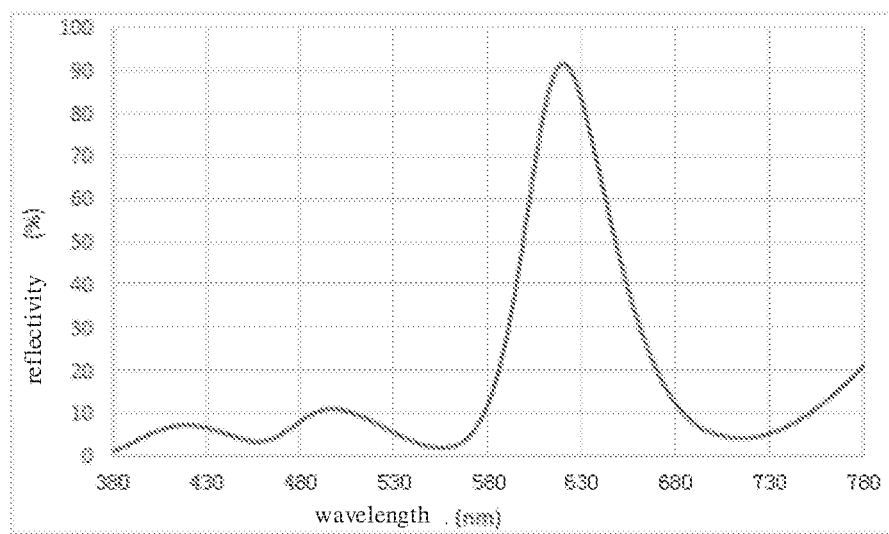
FIG. 5 is a reflection spectrum diagram of the optical resonant cavity provided by at least one embodiment of the present disclosure.
Figure 6:
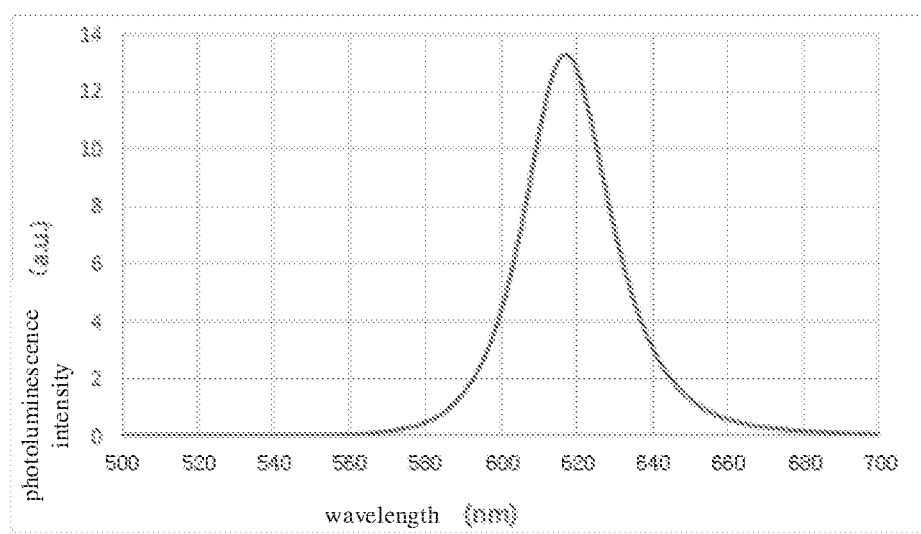
FIG. 6 is a luminescent spectrum diagram of a light conversion material provided by an embodiment of the present disclosure.

FIG. 5 is a reflection spectrum diagram of the light conversion layer of the optical resonant cavity shown in the First Table in a case that no light conversion occurs. In the reflection spectrum diagram, the abscissa indicates the wavelength of light, and the ordinate indicates the reflectivity of light. FIG. 6 is a luminescence spectrum diagram of the light conversion material. In the luminescence spectrum diagram, the abscissa represents the wavelength of light, and the ordinate of the luminescence spectrum diagram represents the photoluminescence intensity of the light conversion material. For example, if light conversion occurs in the light conversion layer of the optical resonant cavity, the light reflection effect of the optical resonant cavity is a superimposed effect of the reflection spectrum in FIG. 5 and the luminescence spectrum of the light conversion material in FIG. 6.

As illustrated in FIG. 5, the optical resonant cavity has a higher reflectivity for the light with the wavelength of about 620 nanometers than the reflectivity for light with other wavelengths. As illustrated in FIG. 6, the wavelength of the light converted from the light conversion material is also concentrated near the wavelength of 620 nm. In a case that the light conversion effect of the light conversion material layer of the optical resonant cavity shown in the First Table occurs, the output of the light with the wavelength of about 620 nanometers from the optical resonant cavity is increased.

For example, in the optical resonant cavity provided by at least one embodiment of the present disclosure, the light with the specific wavelength range is monochromatic light. For example, the monochromatic light is in the visible range, that is, the wavelength range of the light emitted by the optical resonant cavity covers only a wave band of a single color, so that the optical resonant cavity is able to be used as a monochromatic light emitter applicable to display or lighting. For example, the monochromatic light is in the infrared band, so that the optical resonant cavity is applicable to a sensor. For example, in at least one embodiment of the present disclosure, the wavelength range of the light emitted by the optical resonant cavity covers wave bands of a plurality of colors.

The following takes the case that the light emitted from the optical resonant cavity is the monochromatic light as an example, and the technical solution in at least one of the following embodiments of the present disclosure is described.

For example, in the optical resonant cavity provided by at least one embodiment of the present disclosure, the monochromatic light is one of red light, green light and blue light. In this way, the optical resonant cavities emit light of three primary colors; and by combining the optical resonant cavities that emit light of different colors, an image is displayed. In this way, the optical resonant cavity is applicable to the display field.

For example, in the optical resonant cavity provided by at least one embodiment of the present disclosure, a material of the light conversion layer comprises an up-conversion luminescent material and/or a down-conversion luminescent material for obtaining the monochromatic light. The up-conversion luminescent material converts the light with a wavelength greater than the wavelength of the monochromatic light into the monochromatic light, and the down-conversion luminescent material converts the light with a wavelength less than the wavelength of the monochromatic light into the monochromatic light. Various types of light conversion luminescent materials are arranged in the light conversion layer; in this case, the light conversion luminescent materials are arranged to be respectively in a plurality of layers or are doped in a same layer.

In at least one embodiment of the present disclosure, the types of the up-conversion luminescent material and the down-conversion luminescent material are not limited. For example, the down-conversion luminescent material comprises an inorganic luminescent material and/or an organic luminescent material, and further, for example, a fluorescent material or a quantum dot material. The up-conversion luminescent material comprises an inorganic compound doped with rare earth ions. For example, according to the specific band of light emitted by the optical resonant cavity, the up-conversion luminescent material is obtained by doping one or more types of the rare earth ions with corresponding concentration and proportion in inorganic compounds such as fluoride, oxide, sulfur compound, oxyfluoride, halide and the like. For example, the up-conversion luminescent material uses sodium yttrium fluoride ($NaYF_4$) as a matrix material, and is doped with Ytterbium (Yb):thulium (Tm):erbium (Er) with a ratio of (18~60):(0~0.2):(0~2).

For example, the light emitted from the optical resonant cavity is red light. The light conversion layer comprises the down-conversion luminescent material for converting the blue light and/or the green light to the red light. For example, the down-conversion luminescent material comprises a red luminescent material, such as red quantum dots, a red fluorescent material and so on. For example, the down-conversion luminescent material converts the light such as ultraviolet, X-ray, or gamma ray with a wavelength less than the wavelength of the blue light into red light. For example, the light conversion layer comprises the up-conversion luminescent material for converting light such as infrared ray with a wavelength greater than the wavelength of the red light to red light.

For example, the light emitted from the optical resonant cavity is green light. The light conversion layer comprises the down-conversion luminescent material for converting the blue light to the green light and/or the up-conversion luminescent material for converting the red light to the green light. For example, the down-conversion luminescent material comprises a green luminescent material, such as green quantum dots, a green fluorescent material and so on. For example, the up-conversion luminescent material uses sodium yttrium fluoride ($NaYF_4$) as the matrix material, and is doped with Yb:Tm:Er with a ratio of (18~25):0:2. For example, the up-conversion luminescent material converts the infrared light with the wavelength greater than the wavelength of red light into the red light, and the down-conversion luminescent material converts the light such as ultraviolet. X-ray, or gamma ray with the wavelength less than the wavelength of the blue light into blue light.

For example, the light emitted from the optical resonant cavity is blue light. The light conversion layer comprises the up-conversion luminescent material for converting the red light and/or the green light to the blue light. For example, sodium yttrium fluoride ($NaYF_4$) is used as the matrix material, and is doped with Yb:Tm:Er with a ratio of 20:0.2:(0~0.5). For example, the up-conversion luminescent material converts the infrared light with the wavelength greater than the wavelength of red light into the blue light. For example, the light conversion layer comprises the down-conversion luminescent material for converting the light such as ultraviolet, X-ray, or gamma ray with the wavelength less than the wavelength of the blue light into blue light.

For example, in at least one embodiment of the present disclosure, the quantum dots are spherical or sphere-like, and a diameter of each of the quantum dots is between 2 nm and 20 nm. Specific examples of the quantum dots comprise silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots, indium arsenide quantum dots and so on.

In at least one embodiment of the present disclosure, there is no limitation on the refractive index, the extinction coefficient and other parameters of the light conversion layer, and the up-conversion luminescent material or the down-conversion luminescent material is mixed with other materials to obtain the light conversion layer with the corresponding refractive index or the corresponding extinction coefficient. For example, the refractive index of the light conversion layer ranges from 1 to 5, further is 2, 3, 4 and so on. For example, the extinction coefficient of the light conversion layer ranges from 1 to 5, further is 2, 3, 4, and so on. For example, the refractive index and the extinction coefficient of the light conversion layer are arranged to be equal or approximately equal.

For example, in at least one embodiment of the present disclosure, the material of the light conversion layer comprises the quantum dots and silver nanoparticles. By adjusting the ratio of the quantum dots and the silver nanoparticles, the refractive index and the extinction coefficient of the light conversion layer are adjusted. For example, the larger the proportion of the silver nanoparticles in the light conversion layer is, the smaller the refractive index of the light conversion layer is and the larger the extinction coefficient of the light conversion layer is. For example, a volume ratio of the quantum dots to the silver nanoparticles is 66.94% to 33.06%, in this way, the light conversion layer has a same or similar refractive index and a same or similar extinction coefficient as chromium.

For example, in at least one embodiment of the present disclosure, the light conversion layer is used to replace a specific structure layer in the optical resonant cavity, and the specific structure layer is located at the wave node of the design wavelength of the optical resonant cavity. In this way, the design of the film system of the optical resonant cavity is simplified and the cost is reduced at the same time of increasing the output of the light with the design wavelength range.

For example, the optical resonant cavity is provided with a metal layer (such as a chromium layer), the chromium layer is located at the wave node of the design wavelength of the optical resonant cavity. In the operation process of the optical resonant cavity, the chromium layer has a high reflectivity and reflects the light with the design wavelength range, so that the output rate of the light with the design wavelength range is increased; and the chromium layer has a large extinction coefficient and absorbs the light with the non-design wavelength range, so that the output rate of the light with the non-design wavelength range is reduced. For example, in at least one embodiment of the present disclosure, the chromium layer in the optical resonant cavity is replaced by the light conversion layer, and the optical thickness of the light conversion layer is arranged to be the same as an optical thickness of the chromium layer. For example, the refractive index, the extinction coefficient, the actual thickness and other parameters of the light conversion layer are arranged to be equal to those of the chromium layer. In this way, it is not necessary to change the film system of the optical resonant cavity at the same time of increasing the output rate of the light with the design wavelength range, the design parameters of other layers in the optical resonant cavity keep unchanged, so that the manufacturing process of the optical resonant cavity is simplified and the cost is reduced.

At least one embodiment of the present disclosure provides a display panel, and the display panel comprises any one of the optical resonant cavities provided by the above mentioned embodiments. In the display panel, the optical resonant cavity for example emits monochromatic light, and thus it is not necessary to arrange a color filter. Furthermore, the monochromaticity of the light emitted from the optical resonant cavity is good, so the display effect of images is improved, and light with other wavelengths is converted into the monochromatic light to improve the brightness of the emission light.

For example, the display panel comprises any products or components with a display function, such as a tablet computer, a television, a display, a notebook computer, a digital photo frame and a navigator, which is not limited herein in at least one embodiment of the present disclosure.

For example, the display panel provided by at least one embodiment of the present disclosure further comprises a light intensity control structure, the light intensity control structure and the optical resonant cavity are stacked, and the light intensity control structure is configured to control an intensity of light passing through the light intensity control structure. The light intensity control structure controls the intensity of the light, so as to adjust the gray level of the displayed image of the display panel. For example, in at least one embodiment of the present disclosure, the light intensity control structure and the optical resonant cavity are stacked arranged in the light path of the display light, so that the light intensity control structure is able to adjust the gray level of the displayed image. For example, the plane in which the light intensity control structure is located is parallel to the plane in which the optical resonant cavity is located; the light intensity control structure and the optical resonant cavity at least partially overlap in the direction perpendicular to the light intensity control structure.

For example, in at least one embodiment of the present disclosure, the display panel comprises a plurality of pixel units, each of the pixel units is provided with any one of the optical resonant cavities in the above embodiments.

Figure 2A:
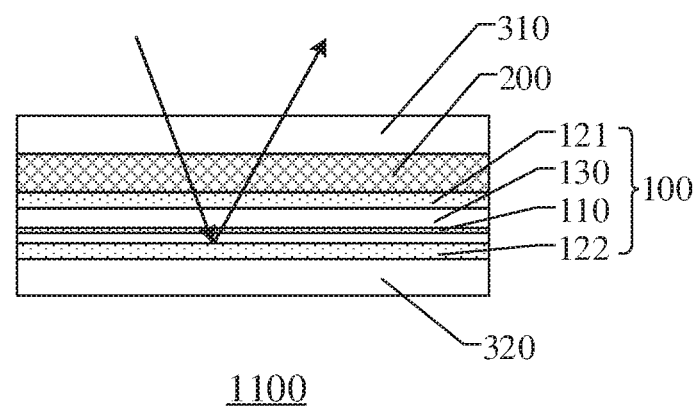
FIG. 2A is a local structural schematic diagram of a display panel provided by at least one embodiment of the present disclosure.
Figure 2B:
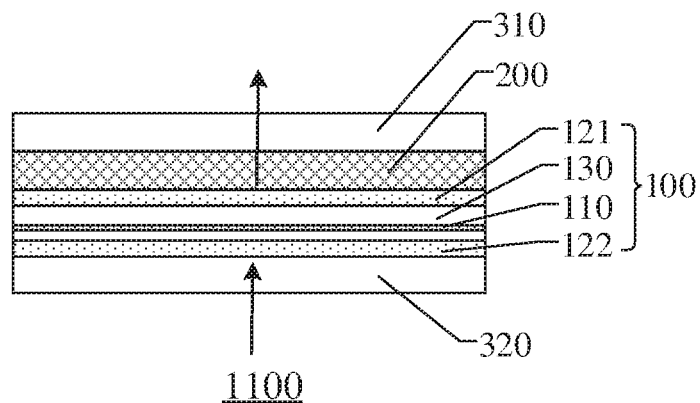
FIG. 2B is a local structural schematic diagram of the display panel provided by another embodiment of the present disclosure.

FIG. 2A is a local structural schematic diagram of the display panel provided by at least one embodiment of the present disclosure, FIG. 2B is a local structural schematic diagram of the display panel provided by another embodiment of the present disclosure, and FIG. 2A and FIG. 2B show the structure of one of the pixel units of the display panel.

For example, as illustrated in FIG. 2A and FIG. 2B, in each of the pixel units 1100, the display panel comprises the light intensity control structure 200, and the light intensity control structure 200 and the optical resonant cavity 100 are stacked in the light path of the display light, and the light intensity control structure 200 is configured to control the intensity of the light passing through the light intensity control structure 200. For example, the light intensity control structure 200 is configured to control the intensity of the light incident into the optical resonant cavity 100 or the light emitted from the optical resonant cavity 100.

For example, as illustrated in FIG. 2A and FIG. 2B, the display panel comprises a first substrate 310 and a second substrate 320. For example, with respect to the second substrate 320, the first substrate 310 is located on a display side of the display panel. For example, the second substrate 320 is an array substrate. For example, in each of the pixel units 1100, the array substrate comprises at least one switching element (such as thin film transistor), the switching element is in signal connection with the light intensity control structure 200 to control the switch of the light intensity control structure 200 and the voltage applied in a switch-on state.

In at least one embodiment of the present disclosure, there is no limitation on the type of the display panel. For example, the display panel is a reflective display panel or a transmissive display panel. In addition, a position relationship between the light intensity control structure 200 and the optical resonant cavity 100 and the type of the optical resonant cavity 100 are selected according to the type of the display panel.

For example, in the display panel provided by at least one embodiment of the present disclosure, the display panel is the reflective display panel: from the display side of the display panel to a non-display side of the display panel, the light intensity control structure and the optical resonant cavity are arranged in sequence, and the optical resonant cavity is the reflective optical resonant cavity to realize light reflection. For example, as illustrated in FIG. 2A, the display panel is the reflective display panel. For example, in the process of display, the external ambient light enters the reflective optical resonant cavity 100 after passing through the light intensity control structure 200, the reflective optical resonant cavity 100 reflects and emits the monochromatic light, and the monochromatic light is emitted out from the display panel after passing through the light intensity control structure 200; during this process, the light intensity control structure 200 adjusts the intensity of the monochromatic light. In this way, there is no need to arrange additional reflection layer in the display panel, so that the structure of the display panel is simplified; and the reflective optical resonant cavity 100 converts the light with other wavelengths in the external ambient light into the monochromatic light, so that the brightness of the monochromatic light is improved, and the brightness of the displayed image is improved compared with the existing reflective display panels.

For example, in a case that the display panel is the reflective display panel, the optical resonant cavity is arranged to be the transmissive optical resonant cavity; accordingly, the second substrate is arranged to be a reflective substrate. In the above case, the position relationship between the light intensity control structure and the optical resonant cavity is not limited, as long as the light intensity control structure and the optical resonant cavity are located on a side, facing the display side, of the second substrate.

For example, in the display panel provided by at least one embodiment of the present disclosure, the display panel is the transmissive display panel, and the optical resonant cavity is the transmissive optical resonant cavity. For example, as illustrated in FIG. 2B, the display panel is the transmissive display panel. For example, during the display process, the light from a backlight source is incident into the transmissive optical resonant cavity 100, the transmissive optical resonant cavity 100 emits the monochromatic light, and the intensity control structure 200 adjusts the intensity of the monochromatic light. The manner that the light from the backlight source enters the light intensity control structure 200 after passing through the optical resonant cavity 100 maximizes the portion, converted to the monochromatic light, of the light from the backlight source, so that the utilization of the light from the backlight source is improved. For example, the light intensity control structure 200 is located on the light input side of the transmissive optical resonant cavity 100, that is, after the intensity of the light from the backlight source is adjusted by the light intensity control structure 200, the light is injected into the transmissive optical resonant cavity 100.

In at least one embodiment of the present disclosure, there is no limitation on the specific structure of the light intensity control structure, as long as the light intensity control structure is able to adjust the brightness of the light.

Figure 3:
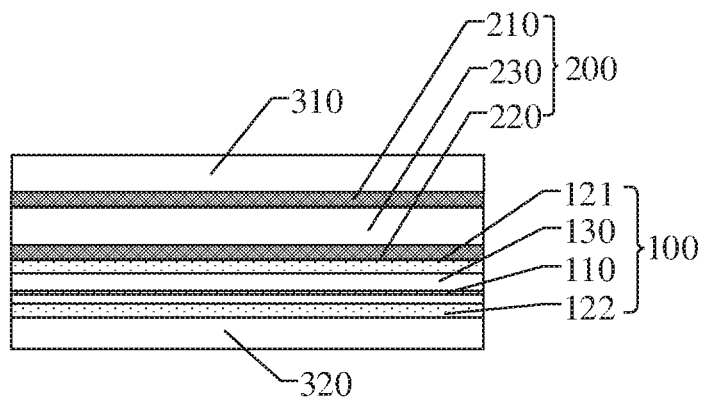
FIG. 3 is a local structural schematic diagram of the display panel provided by still another embodiment of the present disclosure.

For example, in the display panel provided by at least one embodiment of the present disclosure, the light intensity control structure is an electrochromic light intensity control structure, the electrochromic light intensity control structure comprises a first electrode, a second electrode and an electrochromic layer, and the first electrode and the second electrode are configured to control the electrochromic layer if the electric signal is applied to the first electrode and the second electrode. FIG. 3 is a local structural schematic diagram of the display panel provided by still another embodiment of the present disclosure. For example, as illustrated in FIG. 3, the light intensity control structure 200 is the electrochromic light intensity control structure, the electrochromic light intensity control structure 200 comprises the first electrode 210, the second electrode 220 and the electrochromic layer 230. For example, the electrochromic layer 230 is located between the first electrode 210 and the second electrode 220. The electrochromic layer 230 comprises an electrochromic material, the light transmittance of the electrochromic material changes under the action of the electric field between the first electrode 210 and the second electrode 220, for example, the electrochromic material changes from a transparent state to a deep color state. For example, in a case that the first electrode 210 and the second electrode 220 are not applied with the voltage or the voltage applied to the first electrode 210 and the voltage applied to the second electrode 220 are equal, an electrical potential difference between the first electrode 210 and the second electrode 220 is zero, and the electrochromic layer 230 is in the transparent state; in a case that the electrical potential difference between the first electrode 210 and the second electrode 220 is greater than zero, the electrochromic layer 230 is in the deep color state; and the light transmittance of the electrochromic layer 230 decreases with the increase of the electrical potential difference.

In at least one embodiment of the present disclosure, there is no limitation on the type of the electrochromic material in the electrochromic layer. For example, the electrochromic material comprises tungsten trioxide, polythiophenes and their derivatives, violet bases, tetrathiafulvalenes, metal phthalocyanines, and so on.

For example, in at least one embodiment of the present disclosure, the first electrode and the second electrode are transparent electrodes or translucent electrodes. For example, the material of the transparent electrode comprises indium tin oxide (ITO), indium zinc oxide (IZO), indium gallium oxide (IGO), gallium zinc oxide (GZO), zinc oxide (ZnO), indium oxide ($In_2O_3$), zinc oxide (AZO), carbon nanotubes, and so on.

Figure 4A:
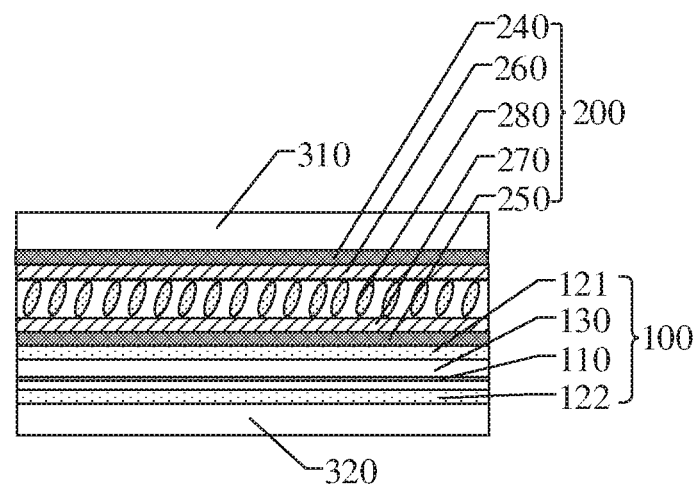
FIG. 4A is a local structural schematic diagram of the display panel provided by still another embodiment of the present disclosure.
Figure 4B:
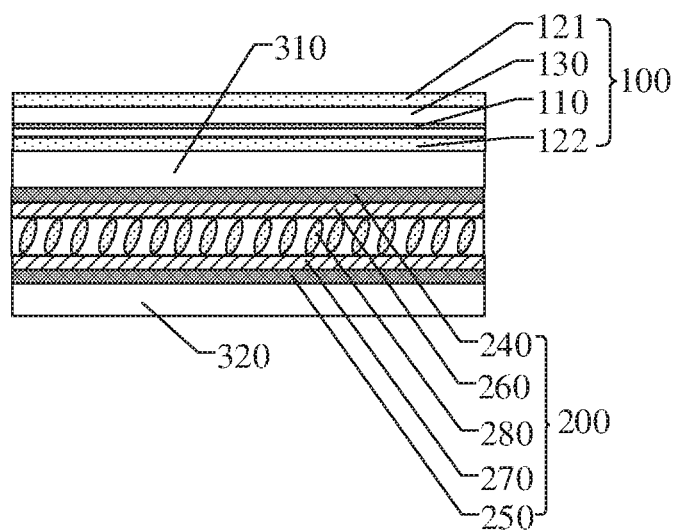
FIG. 4B is a local structural schematic diagram of the display panel provided by still another embodiment of the present disclosure.

For example, in the display panel provided by at least one embodiment of the present disclosure, the light intensity control structure is a liquid crystal light intensity control structure, the liquid crystal light intensity control structure comprises a third electrode, a fourth electrode, a first polarization layer, a second polarization layer and a liquid crystal layer, and the liquid crystal layer is sandwiched between the first polarizing layer and the second polarizing layer, and the third electrode and the fourth electrode are configured to control the liquid crystal layer in a case that the electric signal is applied to the third electrode and the fourth electrode. For example, the first polarization direction of the first polarization layer is perpendicular to the second polarization direction of the second polarization layer, so that the display panel has a normal black state, and the contrast of the displayed image is improved. FIG. 4A is a local structural schematic diagram of the display panel provided by still another embodiment of the present disclosure, and FIG. 4B is a local structural schematic diagram of the display panel provided by still another embodiment of the present disclosure. For example, as shown in FIG. 4A and FIG. 4B, the light intensity control structure 200 is the liquid crystal light intensity control structure, the liquid crystal light intensity control structure 200 comprises the third electrode 240, the fourth electrode 250, the first polarization layer 260, the second polarization layer 270 and the liquid crystal layer 280, and the liquid crystal layer 280 is sandwiched between the first polarization layer 260 and the second polarization layer 270. The deflection of the liquid crystal molecules in the liquid crystal layer 280 is controlled by adjusting the electric field generated between the third electrode 240 and the fourth electrode 250, so that the liquid crystal light intensity control structure has different light transmittance under the deflection of the liquid crystal molecules with the combination of the first polarization layer 260 and the second polarization layer 270. For example, the third electrode 240 and the fourth electrode 250 are on the same side of the liquid crystal layer 280, or are respectively on two sides of the liquid crystal layer 280.

In the display panel provided by at least one embodiment of the present disclosure, in the propagation path of the display light, the optical resonant cavity is located in front of the light intensity control structure, that is, the light enters the light intensity control structure after the light passing through the optical resonant cavity; in this way, the portion, converted to the desired monochromatic light, of the display light is increased, the utilization ratio of the light is increased, and the brightness of the monochromatic light is increased.

For example, as illustrated in FIG. 4A, the display panel is the transmissive display panel, and the optical resonant cavity 100 is located on the side of the light intensity control structure 200 facing the second substrate 320, in this way, the ratio of converting the light from the backlight source to the monochromatic light is increased.

For example, as illustrated in FIG. 4B, the display panel is the reflective display panel, the optical resonant cavity 100 is located on the side of the light intensity control structure 200 facing the first substrate 320, in this way, the ratio of converting the external environment light to the monochromatic light is increased. For example, the third electrode 240 is the transparent electrode or the translucent electrode, and the fourth electrode 250 is the reflective electrode.

It should be noted that, the optical resonant cavity provided by at least one embodiment of the present disclosure is not limited to be used in the display field, but may be applied in other optical fields. For example, the optical resonant cavity is used in the field of laser.

The following points required to be explained:

(1) the drawings of the embodiments of the present disclosure only relate to the structures related to the embodiments of the present disclosure, and other structures may refer to the general design.

(2) for the sake of clarity, in the drawings used to describe the embodiments of the present disclosure, the thickness of layers or regions is enlarged or reduced, that is, the drawings are not drawn according to the actual scale.

(3) without conflict, the embodiments of the present disclosure and the features in the embodiments may be combined with each other to obtain new embodiments.

What are described above is related to only the illustrative embodiments of the present disclosure and not limitative to the protection scope of the present application. Therefore, the protection scope of the present application shall be defined by the accompanying claims.

What is claimed is:

1. A reflective optical resonant cavity, comprising:
a first functional layer;
a second functional layer opposite to the first functional layer;
an optical medium layer between the first functional layer and the second functional layer,
a light conversion layer in the optical medium layer,
wherein the first functional layer is a transflective film, and the second functional layer is a total reflection film, the optical resonant cavity comprises a silver film, a first silicon dioxide film, a light conversion material film, a second silicon dioxide film and a titanium dioxide film which are stacked in sequence; and
the titanium dioxide film is used as the first functional layer, the silver film is used as the second functional layer, the first silicon dioxide film and the second silicon dioxide film are together used as the optical medium layer, and the light conversion material film is used as the light conversion layer.

2. The reflective optical resonant cavity according to claim 1, wherein
a sum of an optical thickness of the optical medium layer and an optical thickness of the light conversion layer is a positive integer multiple of a half of the central wavelength of the light with the specific wavelength range.

3. The reflective optical resonant cavity according to claim 1, wherein
a refractive index of the light conversion layer is greater than a refractive index of the optical medium layer.

4. The reflective optical resonant cavity according to claim 1, wherein
a distance between a thickness center plane of the light conversion layer and the wave node of the center wavelength of the light with the specific wavelength range is not greater than 1/30 of the center wavelength.

5. The reflective optical resonant cavity according to claim 1, wherein
a thickness of the light conversion layer is not more than 1/30 of the central wavelength of the light with the specific wavelength range.

6. The reflective optical resonant cavity according to claim 1, wherein
the light with the specific wavelength range is a monochromatic light.

7. The reflective optical resonant cavity according to claim 6, wherein
the monochromatic light is one of red light, green light and blue light.

8. The reflective optical resonant cavity according to claim 6, wherein
a material of the light conversion layer comprises an up-conversion luminescent material and/or a down-conversion luminescent material for obtaining the monochromatic light.

9. The reflective optical resonant cavity according to claim 8, wherein the up-conversion luminescent material comprises an inorganic compound doped with rare earth ions, and the down-conversion luminescent material comprises a fluorescent material or a quantum dot material.

10. The reflective optical resonant cavity according to claim 1, wherein the optical resonant cavity comprises a plurality of the light conversion layers, the plurality of the light conversion layers are spaced apart from each other, and the plurality of the light conversion layers are arranged at different wave nodes of the central wavelength of the light with the specific wavelength range.

11. The reflective optical resonant cavity according to claim 1, further comprising an antireflection film, wherein the antireflection film is arranged on a side of the first functional layer away from the second functional layer.

12. The reflective optical resonant cavity according to claim 1, further comprising: a metal absorption layer,
wherein the metal absorption layer is arranged on a side of the first functional layer, or is arranged in the first functional layer.

13. A reflective display panel, comprising
a reflective optical resonant cavity, wherein the reflective optical resonant cavity comprises:
a first functional layer;
a second functional layer opposite to the first functional layer;
an optical medium layer between the first functional layer and the second functional layer,
a light conversion layer in the optical medium layer,
wherein the first functional layer is a transflective film, and the second functional layer is a total reflection film; the optical resonant cavity comprises a silver film, a first silicon dioxide film, a light conversion material film, a second silicon dioxide film and a titanium dioxide film which are stacked in sequence; and the titanium dioxide film is used as the first functional layer, the silver film is used as the second functional layer, the first silicon dioxide film and the second silicon dioxide film are together used as the optical medium layer, and the light conversion material film is used as the light conversion layer; and
a light intensity control structure,
wherein the light intensity control structure and the optical resonant cavity are stacked, and the light intensity control structure is configured to control an intensity of light passing through the light intensity control structure.

14. The reflective display panel according to claim 13, wherein
the display panel is a reflective display panel, the light intensity control structure and the optical resonant cavity are arranged in sequence from a display side of the display panel to a non-display side of the display panel.

15. The reflective display panel according to claim 13, wherein
the light intensity control structure is an electrochromic light intensity control structure,
the electrochromic light intensity control structure comprises a first electrode, a second electrode and an electrochromic layer, and the first electrode and the second electrode are configured to control the electrochromic layer if an electric signal is applied to the first electrode and the second electrode.

16. The reflective display panel according to claim 13, wherein the light intensity control structure is a liquid crystal light intensity control structure, the liquid crystal light intensity control structure comprises a third electrode, a fourth electrode, a first polarization layer, a second polarization layer and a liquid crystal layer, a first polarization direction of the first polarization layer is perpendicular to a second polarization direction of the second polarization layer, the liquid crystal layer is sandwiched between the first polarization layer and the second polarization layer, and the third electrode and the fourth electrode are configured to control the liquid crystal layer if an electrical signal is applied to the third electrode and the fourth electrode.

17. The reflective optical resonant cavity according to claim 1, wherein the light conversion layer is arranged at at least one wave node of a center wavelength of light with a specific wavelength range in the optical resonant cavity.

18. The reflective optical resonant cavity according to claim 1, wherein the optical medium layer includes material selected from a group consisting of air, an inorganic material, or an organic material.

19. The reflective optical resonant cavity according to claim 18, wherein the inorganic material is a low refractive index material including silicon dioxide, or magnesium fluoride.

* * * * *